United States Patent
Cooper et al.

(10) Patent No.: US 10,460,954 B2
(45) Date of Patent: Oct. 29, 2019

(54) ANTI-REFLECTIVE COATING CLEANING AND POST-ETCH RESIDUE REMOVAL COMPOSITION HAVING METAL, DIELECTRIC AND NITRIDE COMPATIBILITY

(71) Applicant: ENTEGRIS, INC., Billerica, MA (US)

(72) Inventors: Emanuel I. Cooper, Scarsdale, NY (US); Steven Lippy, Brookfield, CT (US); Lingyan Song, Danbury, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 15/316,358

(22) PCT Filed: Jun. 2, 2015

(86) PCT No.: PCT/US2015/033754
§ 371 (c)(1),
(2) Date: Dec. 5, 2016

(87) PCT Pub. No.: WO2015/187675
PCT Pub. Date: Dec. 10, 2015

(65) Prior Publication Data
US 2017/0200619 A1 Jul. 13, 2017

Related U.S. Application Data

(60) Provisional application No. 62/007,712, filed on Jun. 4, 2014.

(51) Int. Cl.
| | | |
|---|---|---|
| C23F 1/10 | (2006.01) | |
| H01L 21/311 | (2006.01) | |
| C23F 1/26 | (2006.01) | |
| H01L 21/02 | (2006.01) | |
| C09K 13/08 | (2006.01) | |
| C09K 13/10 | (2006.01) | |
| C11D 7/08 | (2006.01) | |
| C11D 7/14 | (2006.01) | |
| C11D 7/22 | (2006.01) | |
| C11D 7/26 | (2006.01) | |
| C11D 7/28 | (2006.01) | |
| C11D 7/32 | (2006.01) | |
| C11D 7/34 | (2006.01) | |
| C11D 7/36 | (2006.01) | |
| C11D 7/50 | (2006.01) | |
| C11D 11/00 | (2006.01) | |
| H01L 21/027 | (2006.01) | |

(52) U.S. Cl.
CPC ........ *H01L 21/31133* (2013.01); *C09K 13/08* (2013.01); *C09K 13/10* (2013.01); *C11D 7/08* (2013.01); *C11D 7/14* (2013.01); *C11D 7/22* (2013.01); *C11D 7/265* (2013.01); *C11D 7/28* (2013.01); *C11D 7/3263* (2013.01); *C11D 7/3281* (2013.01); *C11D 7/34* (2013.01); *C11D 7/36* (2013.01); *C11D 7/5022* (2013.01); *C11D 11/0047* (2013.01); *C23F 1/26* (2013.01); *H01L 21/02063* (2013.01); *H01L 21/02071* (2013.01); *H01L 21/0276* (2013.01); *H01L 21/31111* (2013.01)

(58) Field of Classification Search
CPC .......... C09K 13/06; C09K 13/08; C23F 1/26; H01L 21/31111; H01L 21/02063
USPC ...................... 252/79.1, 79.3, 79.4
See application file for complete search history.

(56) References Cited

U.S. PATENT DOCUMENTS

| | | |
|---|---|---|
| 5,698,503 A | 12/1997 | Ward et al. |
| 6,698,619 B2 | 3/2004 | Wertenberger |
| 7,188,644 B2 | 3/2007 | Kelly et al. |
| 2008/0006305 A1 | 1/2008 | Bernhard et al. |
| 2008/0242574 A1* | 10/2008 | Rath ............... G03F 7/423 510/176 |
| 2009/0301996 A1 | 12/2009 | Visintin et al. |
| 2010/0056409 A1 | 3/2010 | Walker et al. |
| 2017/0200601 A1* | 7/2017 | Song ............... H01L 21/02068 |

FOREIGN PATENT DOCUMENTS

| | | |
|---|---|---|
| CN | 101421386 A | 4/2009 |
| WO | 2006133253 | 12/2006 |
| WO | 2008/141206 A2 | 11/2008 |
| WO | WO-2013101907 A1 * | 7/2013 ............ C09K 13/00 |

OTHER PUBLICATIONS

International Search Report & Written Opinion from PCT/US2015/033754, dated Aug. 31, 2015, 14 pages.

* cited by examiner

*Primary Examiner* — Binh X Tran
(74) *Attorney, Agent, or Firm* — Entegris, Inc.

(57) ABSTRACT

A liquid removal composition and process for removing anti-reflective coating (ARC) material and/or post-etch residue from a substrate having same thereon. The composition achieves at least partial removal of ARC material and/or post-etch residue in the manufacture of integrated circuitry with minimal etching of metal species on the substrate, such as aluminum, copper and cobalt alloys, and without damage to low-k dielectric and nitride-containing materials employed in the semiconductor architecture.

18 Claims, No Drawings

ANTI-REFLECTIVE COATING CLEANING AND POST-ETCH RESIDUE REMOVAL COMPOSITION HAVING METAL, DIELECTRIC AND NITRIDE COMPATIBILITY

CROSS-REFERENCE TO RELATED APPLICATIONS

This application is filed under the provisions of 35 U.S.C. § 371 and claims the priority of International Patent Application No. PCT/US2015/033754 filed on 02 Jun. 2015 entitled "ANTI-REFLECTIVE COATING CLEANING AND POST-ETCH RESIDUE REMOVAL COMPOSITION HAVING METAL, DIELECTRIC AND NITRIDE COMPATIBILITY" in the name of Emanuel I. Cooper, et al., which claims priority to U.S. Provisional Patent Application No. 62/007,712 filed on 04 Jun. 2014, both of which are hereby incorporated by reference herein in their entirety.

FIELD

The present invention relates to a liquid removal composition and process useful for the removal of anti-reflective material and/or post-etch residue from a microelectronic device having said material thereon. The liquid removal composition is compatible with underlying dielectric materials, interconnect metals, e.g., aluminum, copper and cobalt alloy, and nitride-containing layers.

DESCRIPTION OF THE RELATED ART

Upon exposure to deep ultraviolet (DUV) radiation, it is well known that the transmissivity of photoresist combined with the high reflectivity of the substrate to the DUV wavelengths results in the reflection of the DUV radiation back into the photoresist thereby producing standing waves in the photoresist layer. The standing waves trigger further photochemical reactions in the photoresist causing an uneven exposure of the photoresist, including in the masked portions not intended to be exposed to the radiation, which results in variations in linewidths, spacing, and other critical dimensions.

In order to address the transmissivity and reflectivity problems, bi- and tri-layer photoresists, bottom anti-reflective coatings (BARCs) and sacrificial anti-reflective coatings (SARCs) have been developed. These coatings are applied to substrates prior to applying the photoresist. All of these antireflective coatings have a planarizing effect on wafer surfaces encountered in typical dual damascene integration and all incorporate a UV chromophore into a spin-on polymer matrix which will absorb incident UV radiation.

The clean removal of anti-reflective coating (ARC) materials from the microelectronic device wafer has proven to be difficult and/or costly. If not removed, the layers may interfere with subsequent silicidation or contact formation. Typically, the layers are removed by oxidative or reductive plasma ashing or wet cleaning. However, plasma ashing, whereby the substrate is exposed to an oxidative or reductive plasma etch, may result in damage to the dielectric material, either by changing the feature shapes and dimensions, or by increasing the dielectric constant. The latter problem is more pronounced when low-k dielectric materials, such as organosilicate glasses (OSG) or carbon-doped oxide glasses, are the underlying dielectric material. As such, it is often desirable to avoid the use of plasma ashing to remove the ARC layers.

When a cleaner/etchant composition is used in back-end-of-line (BEOL) applications to process aluminum, copper, cobalt alloy or other interconnect metal or interconnect barrier separated by low capacitance (low-k) insulating material or dielectric, it is important that the compositions used to remove ARCs and/or post-etch residue materials possess good metal compatibility, e.g., a low etch rate on copper, aluminum, cobalt, etc., and that the underlying silicate materials remain unaffected by the cleaner composition. Aqueous removal solutions would normally be preferred because of the simpler disposal techniques, however, aqueous removal solutions are known to etch or corrode the metal interconnects.

Accordingly, there is a need in the art for removal compositions having low water content which can completely and efficiently remove ARC layers and/or post-etch residue from the surface of the microelectronic device while simultaneously minimizing damage to the co-extensively present dielectric materials, interconnect metals, and/or nitride-containing materials.

SUMMARY

The present invention generally relates to a liquid removal composition and process useful for the removal of anti-reflective coating material and/or post-etch residue from the surface of a microelectronic device having such material thereon. The liquid removal composition is compatible with low-k dielectric materials, interconnect metals (e.g., aluminum, copper and cobalt alloys), and nitride-containing layers (e.g., silicon nitride).

In one aspect, a liquid removal composition is described, said liquid removal composition comprising at least one fluoride-containing compound, at least one organic solvent, optionally water, and at least one of a dielectric passivating agent and/or a corrosion inhibitor and/or at least one silicon-containing compound, wherein said liquid removal composition is useful for removing anti-reflective coating (ARC) materials and/or post-etch residue from a microelectronic device having such materials and/or residue thereon.

In another aspect, a method of removing ARC material and/or post-etch residue from a microelectronic device having said material and residue thereon, said method comprising contacting the microelectronic device with a liquid removal composition for sufficient time to at least partially remove said material and residue from the microelectronic device, wherein said liquid removal composition comprises at least one fluoride-containing compound, at least one organic solvent, optionally water, and at least one of a dielectric passivating agent and/or a corrosion inhibitor and/or at least one silicon-containing compound.

Other aspects, features, and embodiments of the invention will be more fully apparent from the ensuing disclosure and appended claims.

DETAILED DESCRIPTION, AND PREFERRED EMBODIMENTS THEREOF

The present invention contemplates liquid removal compositions that are useful to remove anti-reflective coating (ARC) materials and/or post-etch residue from the surface of a microelectronic device having said material(s) thereon.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the term "microelectronic device" is not meant to be limiting in any way and includes any substrate or structure that will eventually become a microelectronic device or microelectronic assembly. Notably, the microelectronic device substrate may be patterned, blanketed and/or a test substrate.

"Post-etch residue" and "post-plasma etch residue," as used herein, corresponds to material remaining following gas-phase plasma etching processes, e.g., BEOL dual-damascene processing. The post-etch residue may be organic, organometallic, organosilicic, or inorganic in nature, for example, silicon-containing material, titanium-containing material, nitrogen-containing material, oxygen-containing material, polymeric residue material, copper-containing residue material (including copper oxide residue), tungsten-containing residue material, cobalt-containing residue material, etch gas residue such as chlorine and fluorine, and combinations thereof.

As defined herein, "low-k dielectric material" and ELK ILD materials correspond to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. Most preferably, the low-k dielectric material is deposited using organosilane and/or organosiloxane precursors. It is to be appreciated that the low-k dielectric materials may have varying densities and varying porosities.

As used herein, "about" is intended to correspond to ±5% of the stated value.

As used herein, "suitability" for removing ARC materials and/or post-etch residue from a microelectronic device having said material(s) thereon corresponds to at least partial removal of said ARC and/or post-etch residue material(s) from the microelectronic device. Preferably, at least about 90% of the material(s), more preferably at least 95% of the material(s), and most preferably at least 99% of the material (s), are removed from the microelectronic device using the composition described herein.

As defined herein, "ARC materials" corresponds to bi- and tri-layer photoresists, bottom anti-reflective coatings (BARCs) and sacrificial anti-reflective coatings (SARCs) and can be organic and/or inorganic in nature.

"Substantially devoid" is defined herein as less than 2 wt. %, preferably less than 1 wt. %, more preferably less than 0.5 wt. %, even more preferably less than 0.1 wt. %, and most preferably 0 wt %.

As defined herein, "nitride-containing materials" correspond to silicon nitrides, silicon oxynitrides, silicon carbon nitride, titanium nitride, titanium oxynitride, tantalum nitride, and combinations thereof.

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In one aspect, a liquid removal composition useful in removing ARC layers and/or post-etch residue from a microelectronic device is described. The liquid removal composition comprises at least one fluoride-containing compound, at least one organic solvent, at least one of a dielectric passivating agent and/or a corrosion inhibitor and/or a silicon-containing compound, and optionally water.

In one embodiment of the first aspect, the liquid removal composition comprises, consists of, or consist essentially of at least one fluoride-containing compound, at least one organic solvent, and at least one dielectric passivating agent. In another embodiment, the liquid removal composition comprises, consists of, or consist essentially of at least one fluoride-containing compound, at least one organic solvent, at least one dielectric passivating agent, and water. In yet another embodiment, the liquid removal composition comprises, consists of, or consists essentially of at least one fluoride-containing compound, at least one organic solvent, and at least one corrosion inhibitor. In still another embodiment, the liquid removal composition comprises, consists of, or consist essentially of at least one fluoride-containing compound, at least one organic solvent, at least one corrosion inhibitor, and water. In another embodiment, the liquid removal composition comprises, consists of, or consists essentially of at least one fluoride-containing compound, at least one organic solvent, and at least one silicon-containing compound. In yet another embodiment, the liquid removal composition comprises, consists of, or consists essentially of at least one fluoride-containing compound, at least one organic solvent, at least one silicon-containing compound, and water. In another embodiment, the liquid removal composition comprises, consists of, or consists essentially of at least one fluoride-containing compound, at least one organic solvent, at least one dielectric passivating agent, and at least one corrosion inhibitor. In yet another embodiment, the liquid removal composition comprises, consists of, or consists essentially of at least one fluoride-containing compound, at least one organic solvent, at least one dielectric passivating agent, at least one corrosion inhibitor, and water. In another embodiment, the liquid removal composition comprises, consists of, or consists essentially of at least one fluoride-containing compound, at least one organic solvent, at least one corrosion inhibitor, and at least one silicon-containing compound. In still another embodiment, the liquid removal composition comprises, consists of, or consist essentially of at least one fluoride-containing compound, at least one organic solvent, at least one corrosion inhibitor, at least one silicon-containing compound, and water. In yet another embodiment, the liquid removal composition comprises, consists of, or consists essentially of at least one fluoride-containing compound, at least one organic solvent, at least one dielectric passivating agent, and at least one silicon-containing compound. In still another embodiment, the liquid removal composition comprises, consists of, or consists essentially of at least one fluoride-containing compound, at least one organic solvent, at least one dielectric passivating agent, at least one silicon-containing compound, and water. In yet another embodiment, the liquid removal composition comprises, consists of, or consists essentially of at least one fluoride-containing compound, at least one organic solvent, at least one corrosion inhibitor, at least one dielectric passivating agent, and at least one silicon-containing compound. In still another embodiment, the liquid removal composition comprises, consists of, or consists essentially of at least one fluoride-containing compound, at least one organic solvent, at least one corrosion inhibitor, at least one dielectric passivating agent, at least one silicon-containing compound, and water.

The liquid removal compositions of the first aspect have a pH value in a range from about 1 to about 5, more preferably less than about 4. Preferably, the composition is substantially devoid of oxidizing agents (e.g., hydrogen peroxide), quaternary ammonium hydroxide compounds, and chemical mechanical polishing abrasives.

Preferably, the liquid removal composition includes the following components in the percentages by weight indicated, based on the total weight of the composition, wherein the total of the weight percentages of such components of the composition does not exceed 100 weight %.

| component of | % by weight |
| --- | --- |
| fluoride-containing compound(s) | about 0.01% to about 5.0% |
| organic solvent(s) | about 90.0% to about 99.9% |
| water | about 0% to about 5.0% |
| dielectric passivating agent(s) (when present) | about 0.01 wt % to about 2 wt % |
| corrosion inhibitor(s) (when present) | about 0.01 wt % to about 20 wt % |
| silicon-containing compound(s) (when present) | about 0.01 wt % to about 2 wt % |

In a particularly preferred embodiment, water is present in an amount in a range from about 0.01 wt. % to about 1 wt. %, is de-ionized and non-ozonated, and is either added to the composition or residually present in one of the other components.

Suitable sources of fluoride-containing compounds include, but are not limited to, hydrogen fluoride, ammonium fluoride, fluoroboric acid, tetramethylammonium fluoride (TMAF) and triethanolamine hydrofluoric acid salt. Alternatively, salts of bifluorides may be used, including ammonium bifluoride ($(NH_4)HF_2$) and tetraalkylammonium bifluorides ($(R)_4NHF_2$, where R is methyl, ethyl, propyl, butyl, phenyl, benzyl, or fluorinated $C_1$-$C_4$ alkyl groups). Combinations of two or more fluoride species is also contemplated herein. In a preferred embodiment, the fluoride-containing compound includes hydrogen fluoride. Notably, hydrogen fluoride is typically shipped with residual quantities of water and as such, water may be present in the removal composition even though no water is intentionally added thereafter. Preferably, the fluoride-containing compound(s) comprise hydrogen fluoride or ammonium bifluoride.

The organic solvent species are thought to serve as a solvent and assist in the dissolution of organic residues that may be present in the ARC and/or post-etch residue. Suitable solvent species for such composition include, without limitation: tetramethylene sulfone; straight-chained or branched $C_1$-$C_6$ alcohols including, but not limited to, methanol, ethanol, 1-propanol, 2-propanol, 1-butanol, 2-butanol, t-butanol, 1-pentanol, hexanol, cyclohexanol, 2-ethyl-1-hexanol; benzyl alcohol, furfuryl alcohol; glycols such as ethylene glycol, diethylene glycol, propylene glycol (1,2-propanediol), tetramethylene glycol (1,4-butanediol), 2,3-butanediol, 1,3-butanediol, and neopentyl glycol; or glycol ethers such as diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, propylene glycol methyl ether, dipropylene glycol methyl ether, tripropylene glycol methyl ether, propylene glycol n-propyl ether, dipropylene glycol n-propyl ether, tripropylene glycol n-propyl ether, propylene glycol n-butyl ether, dipropylene glycol n-butyl ether, and tripropylene glycol n-butyl ether. Other solvents that are useful are typical polar solvents such dimethylacetamide, formamide, dimethylformamide, 1-methyl-2-pyrrolidinone, dimethyl sulfoxide, tetrahydrofurfuryl alcohol (THFA), and other polar solvents. Combinations of two or more solvent species are also contemplated herein. Preferably, the organic solvent(s) comprise 1,4-butanediol, n-butanol, ethylene glycol, propylene glycol, and combinations thereof.

When present, the corrosion inhibitor(s) reduce the attack on the metals, e.g., copper and/or cobalt, in the underlying layers. The corrosion inhibitor(s) may be of any suitable type, and may include, without limitation, benzotriazole (BTA), 1,2,4-triazole (TAZ), 5-aminotetrazole (ATA), 1-hydroxybenzotriazole, 5-amino-1,3,4-thiadiazol-2-thiol, 3-amino-1H-1,2,4 triazole, 3,5-diamino-1,2,4-triazole, tolyltriazole, 5-phenyl-benzotriazole, 5-nitro-benzotriazole, 3-amino-5-mercapto-1,2,4-triazole, 1-amino-1,2,4-triazole, 2-(5-amino-pentyl)-benzotriazole, 1-amino-1,2,3-triazole, 1-amino-5-methyl-1,2,3-triazole, 3-mercapto-1,2,4-triazole, 3-isopropyl-1,2,4-triazole, 5-phenylthiol-benzotriazole, halo-benzotriazoles (halo=F, Cl, Br or I), naphthotriazole, 1H-tetrazole-5-acetic acid, 2-mercaptobenzothiazole (2-MBT), 1-phenyl-2-tetrazoline-5-thione, 2-mercaptobenzimidazole (MBI), 4-methyl-2-phenylimidazole, 2-mercaptothiazoline, 2,4-diamino-6-methyl-1,3,5-triazine, thiazole, imidazole, benzimidazole, triazine, methyltetrazole, Bismuthiol I, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 5-amino-1,3,4-thiadiazole-2-thiol, benzothiazole, tritolyl phosphate, indazole, DNA bases, pyrazoles, propanethiol, ascorbic acid, thiourea, 1,1,3,3-tetramethylurea, urea, urea derivatives, uric acid, potassium ethylxanthate, glycine, dodecylbenzenesulfonic acid (DDBSA), tartaric acid, N,N-dimethylacetoacetamide, 1-nitroso-2-napthol, polysorbate 80 (Tween 80), dodecylphosphonic acid (DDPA), ethylenediaminetetraacetic acid (EDTA), (1,2-cyclohexylenedinitrilo)tetraacetic acid (CDTA), diethylenetriamine pentaacetic acid (DTPA), 2-phosphonobutane-1,2,4-tricarboxylic acid (PBTCA), ethylendiamine disuccinic acid, and propylenediamine tetraacetic acid; phosphonic acid; phosphonic acid derivatives such as hydroxyethylidene diphosphonic acid (HEDP) (Dequest 2010), 1-hydroxyethane-1,1-diphosphonic acid, nitrilo-tris(methylenephosphonic acid) (NTMP), amino tri (methylene phosphonic acid) (Dequest 2000), diethylenetriamine penta(methylene phosphonic acid) (Dequest 2060S), ethylenediamine tetra (methylene phosphonic acid) (EDTMPA), and combinations thereof. Combinations of two or more corrosion inhibitors are also contemplated herein. Preferably, the corrosion inhibitor(s), when present, comprise DDPA.

Dielectric passivating agent(s), when present, are added to improve the compatibility of the liquid removal composition with the nitride-containing material and include, but are not limited to, malonic acid, boric acid, ammonium biborate, borate salts (e.g., ammonium pentaborate, sodium tetraborate, and ammonium biborate), 3-hydroxy-2-naphthoic acid, iminodiacetic acid, and combinations thereof. Preferably, the dielectric passivating agent(s), when present, comprise boric acid.

Compositions of the first aspect can further include at least one silicon-containing compound to reduce the activity of the fluoride-containing compound(s). In one embodiment, the at least one silicon-containing compound comprises an alkoxysilane. Alkoxysilanes contemplated have the general formula $SiR^1R^2R^3R^4$, wherein the $R^1$, $R^2$, $R^3$ and $R^4$ are the same as or different from one another and are selected from the group consisting of straight-chained $C_1$-$C_6$ alkyl groups (e.g., methyl, ethyl, propyl, butyl, pentyl, hexyl), branched $C_1$-$C_6$ alkyl groups, $C_1$-$C_6$ alkoxy groups (e.g, methoxy, ethoxy, propoxy, butoxy, pentoxy, hexoxy), a phenyl group, and a combination thereof. It should be appreciated by the skilled artisan, that to be characterized as an alkoxysilane, at least one of $R^1$, $R^2$, $R^3$ or $R^4$ must be a $C_1$-$C_6$ alkoxy group. Alkoxysilanes contemplated include methyltrimethoxysilane, dimethyldimethoxysilane, phenyltrimethoxysilane, tetraethoxysilane (TEOS), N-propyltrime thoxysilane, N-propyltriethoxysilane, hexyltrimethoxysilane, hexyltriethoxysilane, and combinations thereof. Other silicon-containing compounds that can be used instead or in addition to the alkoxysilanes include ammonium hexafluorosilicate, sodium silicate, potassium silicate, tetramethyl ammonium silicate (TMAS), tetraacetoxysilane, di-t-butoxydiacetoxysilane, acetoxymethyltriethoxysilane, and combinations thereof. Preferably, the silicon-containing compound comprises TMAS.

In various preferred embodiments, the removal composition is formulated in the following embodiments A1-A9, wherein all percentages are by weight, based on the total weight of the formulation:

Embodiment A1

| component of | % by weight | preferably (% by weight) | most preferably (% by weight) |
|---|---|---|---|
| fluoride-containing compound(s) | about 0.01% to about 25% | about 0.01% to about 5% | about 0.25% to about 1% |
| organic solvent(s) | about 0.01% to about 99.9% | about 88.5% to about 99.97% | about 97% to about 99.49% |
| water | about 0.01% to about 10% | about 0.01% to about 5% | about 0.25% to about 1% |
| dielectric passivating agent(s) | about 0.01% to about 2% | about 0.01% to about 1.5% | about 0.01% to about 1% |

Embodiment A2

| component of | % by weight | preferably (% by weight) | most preferably (% by weight) |
|---|---|---|---|
| fluoride-containing compound(s) | about 0.01% to about 25% | about 0.01% to about 5% | about 0.25% to about 1% |
| alcohol(s) | about 0.01% to about 99% | about 5% to about 90% | about 7% to about 74.5% |
| glycol(s) | about 0.01% to about 99% | about 10% to about 99% | about 25% to about 90% |
| water | about 0.01% to about 10% | about 0.01% to about 5% | about 0.25% to about 1% |
| dielectric passivating agent(s) | about 0.01% to about 2% | about 0.01% to about 1.5% | about 0.01% to about 1% |

Embodiment A3

| component of | % by weight | preferably (% by weight) | most preferably (% by weight) |
|---|---|---|---|
| fluoride-containing compound(s) | about 0.01% to about 25% | about 0.01% to about 5% | about 0.25% to about 1% |
| organic solvent(s) | about 0.01% to about 99.9% | about 83.5% to about 99.96% | about 96% to about 99.48% |
| water | about 0.01% to about 10% | about 0.01% to about 5% | about 0.25% to about 1% |
| dielectric passivating agent(s) | about 0.01% to about 2% | about 0.01% to about 1.5% | about 0.01% to about 1% |
| corrosion inhibitor(s) | about 0.01% to about 20% | about 0.01% to about 5% | about 0.01% to about 1% |

Embodiment A4

| component of | % by weight | preferably (% by weight) | most preferably (% by weight) |
|---|---|---|---|
| fluoride-containing compound(s) | about 0.01% to about 25% | about 0.01% to about 5% | about 0.25% to about 1% |
| alcohol(s) | about 0.01% to about 99% | about 5% to about 90% | about 6% to about 74.5% |

-continued

| component of | % by weight | preferably (% by weight) | most preferably (% by weight) |
|---|---|---|---|
| glycol(s) | about 0.01% to about 99% | about 10% to about 99% | about 25% to about 90% |
| water | about 0.01% to about 10% | about 0.01% to about 5% | about 0.25% to about 1% |
| dielectric passivating agent(s) | about 0.01% to about 2% | about 0.01% to about 1.5% | about 0.01% to about 1% |
| corrosion inhibitor(s) | about 0.01% to about 20% | about 0.01% to about 5% | about 0.01% to about 1% |

Embodiment A5

| component of | % by weight | preferably (% by weight) | most preferably (% by weight) |
|---|---|---|---|
| fluoride-containing compound(s) | about 0.01% to about 25% | about 0.01% to about 5% | about 0.25% to about 1% |
| organic solvent(s) | about 0.01% to about 99.9% | about 85% to about 99.97% | about 97% to about 99.49% |
| water | about 0.01% to about 10% | about 0.01% to about 5% | about 0.25% to about 1% |
| corrosion inhibitor(s) | about 0.01% to about 20% | about 0.01% to about 5% | about 0.01% to about 1% |

Embodiment A6

| component of | % by weight | preferably (% by weight) | most preferably (% by weight) |
|---|---|---|---|
| fluoride-containing compound(s) | about 0.01% to about 25% | about 0.01% to about 5% | about 0.25% to about 1% |
| alcohol(s) | about 0.01% to about 99% | about 5% to about 90% | about 7% to about 74.5% |
| glycol(s) | about 0.01% to about 99% | about 10% to about 99% | about 25% to about 90% |
| water | about 0.01% to about 10% | about 0.01% to about 5% | about 0.25% to about 1% |
| corrosion inhibitor(s) | about 0.01% to about 20% | about 0.01% to about 5% | about 0.01% to about 1% |

Embodiment A7

| component of | % by weight | preferably (% by weight) | most preferably (% by weight) |
|---|---|---|---|
| fluoride-containing compound(s) | about 0.01% to about 25% | about 0.01% to about 5% | about 0.25% to about 1% |
| organic solvent(s) | about 0.01% to about 99.9% | about 83.5% to about 99.96% | about 96% to about 99.48% |
| water | about 0.01% to about 10% | about 0.01% to about 5% | about 0.25% to about 1% |
| silicon-containing compound(s) | about 0.01% to about 2% | about 0.01% to about 1.5% | about 0.01% to about 1% |
| corrosion inhibitor(s) | about 0.01% to about 20% | about 0.01% to about 5% | about 0.01% to about 1% |

Embodiment A8

| component of | % by weight | preferably (% by weight) | most preferably (% by weight) |
|---|---|---|---|
| fluoride-containing compound(s) | about 0.01% to about 25% | about 0.01% to about 5% | about 0.25% to about 1% |
| alcohol(s) | about 0.01% to about 99% | about 5% to about 90% | about 6% to about 74.5% |

-continued

| component of | % by weight | preferably (% by weight) | most preferably (% by weight) |
| --- | --- | --- | --- |
| glycol(s) | about 0.01% to about 99% | about 10% to about 99% | about 25% to about 90% |
| water | about 0.01% to about 10% | about 0.01% to about 5% | about 0.25% to about 1% |
| silicon-containing compound(s) | about 0.01% to about 2% | about 0.01% to about 1.5% | about 0.01% to about 1% |
| corrosion inhibitor(s) | about 0.01% to about 20% | about 0.01% to about 5% | about 0.01% to about 1% |

Embodiment A9

| component of | % by weight | preferably (% by weight) | most preferably (% by weight) |
| --- | --- | --- | --- |
| fluoride-containing compound(s) | about 0.01% to about 25% | about 0.01% to about 5% | about 0.25% to about 1% |
| glycol(s) | about 0.01% to about 99.9% | about 83.5% to about 99.96% | about 96% to about 99.48% |
| water | about 0.01% to about 10% | about 0.01% to about 5% | about 0.25% to about 1% |
| dielectric passivating agent(s) | about 0.01% to about 2% | about 0.01% to about 1.5% | about 0.01% to about 1% |
| corrosion inhibitor(s) | about 0.01% to about 20% | about 0.01% to about 5% | about 0.01% to about 1% |

The liquid removal compositions described herein are particularly effective at removing ARC layers and/or post-etch residue from a microelectronic device substrate with minimal damage to the metal interconnecting species, the low-k dielectric material, and/or the nitride-containing materials. Metals of interest include, but are not limited to, copper, tungsten, cobalt, aluminum, tantalum and ruthenium. Preferably, the composition removes greater than 95% of the ARC material and/or post-etch residue and has a cobalt etch rate less than about 5 Å min$^{-1}$ at 40° C.

In yet another embodiment, the liquid removal composition comprises at least one fluoride-containing compound, at least one organic solvent, at least one of a dielectric passivating agent and/or a corrosion inhibitor and/or at least one silicon-containing compound, optionally water, and residue material, wherein the residue material includes ARC and/or post-etch residue. Importantly, the residue material may be dissolved and/or suspended in the liquid removal composition described herein.

The liquid removal compositions described herein are easily formulated by simple addition of the respective ingredients and mixing to homogeneous condition. Furthermore, the liquid removal compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the liquid removal composition, i.e., more dilute or more concentrated, in the broad practice of the invention, and it will be appreciated that the liquid removal compositions of the invention can variously and alternatively comprise, consist or consist essentially of any combination of ingredients consistent with the disclosure herein.

Accordingly, another aspect of the invention relates to a kit including, in one or more containers, one or more components adapted to form the compositions described herein. For example, the kit may include, in one or more containers, at least one fluoride-containing compound, at least one organic solvent, and at least one of a dielectric passivating agent and/or a corrosion inhibitor and/or at least one silicon-containing compound, for combining with water at the fab or the point of use. Alternatively, the kit may include, in one or more containers, at least one fluoride-containing compound, and at least one of a dielectric passivating agent and/or a corrosion inhibitor and/or at least one silicon-containing compound, for combining with the at least one solvent at the fab or the point of use. In still another embodiment, the kit may include, in one or more containers, at least one fluoride-containing compound, a first organic solvent, and at least one of a dielectric passivating agent and/or a corrosion inhibitor and/or at least one silicon-containing compound, for combining with more of the first organic solvent and/or a second organic solvent at the fab or the point of use. The containers of the kit must be suitable for storing and shipping said liquid removal compositions, for example, NOWPak® containers (Advanced Technology Materials, Inc., Danbury, Conn., USA).

The one or more containers which contain the components of the removal composition preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended cleaning composition to a process tool.

Substantially chemically inert, impurity-free, flexible and resilient polymeric film materials, such as high density polyethylene, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin (additive-free) polyethylene, virgin polytetrafluoroethylene (PTFE), polypropylene, polyurethane, polyvinylidene chloride, polyvinylchloride, polyacetal, polystyrene, polyacrylonitrile, polybutylene, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" and U.S. Patent Application No. 60/916,966 entitled "SYSTEMS AND METHODS FOR MATERIAL BLENDING AND DISTRIBUTION" filed on May 9, 2007 in the name of John E. Q. Hughes, and PCT/US08/63276 entitled "SYSTEMS AND METHODS FOR MATERIAL BLENDING AND DISTRIBUTION" filed on May 9, 2008 in the name of Advanced Technology Materials, Inc.

In removal application, the removal composition is applied in any suitable manner to the microelectronic device to be cleaned, e.g., by spraying the removal composition on the surface of the microelectronic device, by dipping the microelectronic device in a volume of the cleaning composition, by contacting the microelectronic device to be cleaned with another material, e.g., a pad, or fibrous sorbent applicator element, that is saturated with the removal composition, by contacting the microelectronic device with a circulating removal composition, or by any other suitable means, manner or technique, by which the removal composition is brought into removal contact with microelectronic device to be cleaned.

As applied to semiconductor manufacturing operations, the liquid removal compositions described herein are usefully employed to remove ARC and/or post-etch residue materials from microelectronic device structures having such material(s) thereon. The removal compositions, by virtue of their selectivity for such ARC materials and/or post-etch residue materials, relative to other materials that may be present on the microelectronic device and exposed to the removal composition, such as low-k dielectric structures, metallization, barrier layers, etc., achieve at least partial removal of the ARC and/or post-etch residue material(s) in a highly efficient manner. Moreover, the removal compositions have a low amount of water, e.g., less than about 1 percent by weight, and as such, are compatible with metal interconnect layers such as copper, aluminum and cobalt. The copper and/or cobalt etch rates in the presence of the compositions of the invention are preferably less than 5 Å/min, more preferably less than 2 Å/min, most preferably less than 1 Å/min.

In use of the removal compositions for removing ARC materials and/or post-etch residue from microelectronic device substrates having same thereon, the composition typically is contacted with the device substrate for a time of from about 1 to about 60 minutes, preferably about 20 to about 30 minutes, at temperature in a range of from about 20° C. to about 80° C. Such contacting times and temperatures are illustrative, and any other suitable time and temperature conditions may be employed that are efficacious to at least partially remove the ARC material and/or post-etch residue from the device substrate. As defined herein, "at least partial removal" corresponds to at least 50% removal of ARC material and/or post-etch residue, preferably at least 80% removal. Most preferably, at least 90% of the ARC material and/or post-etch residue is removed using the liquid removal compositions described herein.

Following the achievement of the desired cleaning action, the removal composition is readily removed from the device to which it has previously been applied, e.g., by rinse, wash, or other removal step(s), as may be desired and efficacious in a given end use application of the compositions described herein. For example, the device may be rinsed with deionized water.

A still further embodiment relates to methods of manufacturing an article comprising a microelectronic device, said method comprising contacting the microelectronic device with a liquid removal composition for sufficient time to remove ARC and/or post-etch residue materials from the microelectronic device having said materials thereon, and incorporating said microelectronic device into said article, wherein the liquid removal composition includes at least one fluoride-containing compound, at least one organic solvent, at least one of a dielectric passivating agent and/or a corrosion inhibitor and/or at least one silicon-containing compound, and optionally water. The low-k dielectric and/or nitride etch rates in the presence of the compositions of the invention are preferably less than 5 Å/min, more preferably less than 2 Å/min, most preferably less than 1 Å/min.

Another aspect relates to an article of manufacture comprising a removal composition, a microelectronic device wafer, and ARC material and/or post-etch residue, wherein the removal composition comprises at least one fluoride-containing compound, at least one organic solvent, at least one of a dielectric passivating agent and/or a corrosion inhibitor and/or at least one silicon-containing compound, and optionally water.

The features and advantages of the invention are more fully shown by the illustrative examples discussed below.

EXAMPLE 1

Removal compositions comprising at least one fluoride-containing compound (i.e., HF, which contains naturally present water), at least one organic solvent, and at least one dielectric passivating agent were prepared and the etch rates of TiON (at 20 min) and SiN (at 60 min) were determined as well as the loss of cobalt (at 5 min) from a cobalt coupon. The experiments were all performed at 35° C. The etch rate of TiON was used to simulate Ti-containing residues and hence the removal of same from a surface. The results are provided in Table 1 below.

TABLE 1

| | | Formulations A-G | | | | |
|---|---|---|---|---|---|---|
| Form. | HF (48%)/ wt % | solvents/ wt % | boric acid/ wt % | TiON ER/ Å min$^{-1}$ | Co loss/ Å min$^{-1}$ | SiN ER/ Å min$^{-1}$ |
| A | 0.750 | 50-90.00 wt % 1,4-butanediol 10-50 wt % n-butanol | | <0.5 | 131.5 | 2.9 |
| B | 99.85 wt % formulation A for a total solution weight of 100.000 wt % | | 0.15 | <0.5 | 159.5 | 1.4 |
| C | 99.75 wt % formulation A for a total solution weight of 100.000 wt % | | 0.25 | <0.5 | 123.7 | 0.9 |
| D | 99.625 wt % formulation A for a total solution weight of 100.000 wt % | | 0.375 | <0.5 | 166.2 | 4.2 |
| E | 98.5 wt % formulation A + 0.75 wt % HF (48%) for a total solution weight of 100.000 wt % | | 0.75 | <0.5 | 181.0 | 1.4 |
| F | 98.875 wt % formulation A + 0.75 wt % HF (48%) for a total solution weight of 100.000 wt % | | 0.375 | <0.5 | 193.3 | 2.3 |
| G | 99.8125 wt % formulation A for a total solution weight of 100.000 wt % | | 0.1875 | <0.5 | 115.0 | 1.3 |

It can be seen that the inclusion of the passivating agent(s) decreased the silicon nitride etch rate, relative to the control (formulation A), but the overall performance was also dependent on the concentration of fluoride-containing compound. In each case the TiN etch rate at 5 minutes was below 0.5 Å/min and the W etch rate at 30 minutes was below 0.5 Å/min.

EXAMPLE 2

Removal compositions comprising at least one fluoride-containing compound, at least one organic solvent, and at least one dielectric passivating agent and/or at least one corrosion inhibitor, were prepared and the etch rates of TiON (at 20 min) and SiN (at 30 min) were determined as well as the loss of cobalt (at 5 min) from a cobalt coupon. The experiments were all performed at 40° C., unless indicated otherwise. The etch rate of TiON was used to simulate Ti-containing residues and hence the removal of same from a surface. The results are provided in Table 2 below.

TABLE 2

| | Formulations H-FF | | | | |
|---|---|---|---|---|---|
| Form. | | corr. inh./wt % | TiON ER/ Å min$^{-1}$ | Co loss/ Å min$^{-1}$ | SiN ER/ Å min$^{-1}$ |
| H | 99.965 wt % formulation A for a total solution weight of 100.000 | 0.035 DDBSA | 2.2 | 67.5 | 4.0 |
| I | 99.86 wt % formulation A for a total solution weight of 100.000 wt % | 0.14 DDBSA | 7.7 | 84.0 | 3.6 |
| J (35° C.) | 99.999 wt % formulation A for a total solution weight of 100.000 wt % | 0.001 CDTA | 4.9 | 97.4 | 4.0 |
| K (35° C.) | 99.997 wt % formulation A for a total solution weight of 100.000 wt % | 0.003 CDTA | 4.3 | 69.4 | 3.2 |
| L (35° C.) | 99.999 wt % formulation A for a total solution weight of 100.000 wt % | 0.001 DTPA | 3.1 | 76.9 | 3.1 |
| M (35° C.) | 99.995 wt % formulation A for a total solution weight of 100.000 wt % | 0.005 DTPA | 9.9 | 69.1 | 3.1 |
| N (35° C.) | 99.975 wt % formulation A for a total solution weight of 100.000 wt % | 0.025 DTPA | 5.8 | 21.4 | 3.5 |
| O (35° C.) | 99.997 wt % formulation A for a total solution weight of 100.000 wt % | 0.003 HEDP | 1.7 | 103.5 | 4.4 |
| P (35° C.) | 99.990 wt % formulation A for a total solution weight of 100.000 wt % | 0.010 HEDP | 0.7 | 70.6 | 3.1 |
| Q (35° C.) | 99.950 wt % formulation A for a total solution weight of 100.000 wt % | 0.050 HEDP | <0.5 | 72.2 | 3.2 |
| R (35° C.) | 99.997 wt % formulation A for a total solution weight of 100.000 wt % | 0.003 NTMP (50%) | <0.5 | 98.7 | 6.3 |
| S (35° C.) | 99.995 wt % formulation A for a total solution weight of 100.000 wt % | 0.005 NTMP (50%) | <0.5 | 68.7 | 3.3 |
| T | 99.965 wt % formulation C for a total solution weight of 100.000 wt % | 0.035 DDBSA | <0.5 | 54.7 | 0.6 |
| U | 99.86 wt % formulation C for a total solution weight of 100.000 wt % | 0.14 DDBSA | <0.5 | 44.2 | 0.6 |
| V | 99.99 wt % formulation C for a total solution weight of 100.000 wt % | 0.010 TA | <0.5 | 143.1 | <0.5 |

TABLE 2-continued

Formulations H-FF

| Form. | | corr. inh./wt % | TiON ER/ Å min$^{-1}$ | Co loss/ Å min$^{-1}$ | SiN ER/ Å min$^{-1}$ |
|---|---|---|---|---|---|
| W | 99.95 wt % formulation C for a total solution weight of 100.000 wt % | 0.050 TA | <0.5 | 109.0 | <0.5 |
| X | 95 wt % formulation C for a total solution weight of 100.000 wt % | 5.000 DMA | 0.5 | 149.0 | 0.7 |
| Y | 80 wt % formulation C for a total solution weight of 100.000 wt % | 20.000 DMA | <0.5 | 77.8 | 0.5 |
| Z | 95 wt % formulation C for a total solution weight of 100.000 wt % | 5.000 DMA | <0.5 | 149.2 | 1.0 |
| AA | 80 wt % formulation C for a total solution weight of 100.000 wt % | 20.000 DMA | <0.5 | 121.8 | 0.7 |
| BB | 99.95 wt % formulation C for a total solution weight of 100.000 wt % | 0.05 NN | 0.7 | 59.0 | 1.2 |
| CC | 99.98 wt % formulation C for a total solution weight of 100.000 wt % | 0.2 NN | 1.1 | 207.1 | 0.9 |
| DD | 99.98 wt % formulation C for a total solution weight of 100.000 wt % | 0.20 Bis | <0.5 | 186.2 | <0.5 |
| EE | 99.95 wt % formulation C for a total solution weight of 100.000 wt % | 0.05 DDPA | <0.5 | 15.9 | <0.5 |
| FF | 99.75 wt % formulation C for a total solution weight of 100.000 wt % | 0.25 DDPA | <0.5 | 14.8 | <0.5 |

DDBSA = dodecylbenzenesulfonic acid
TA = tartaric acid
DMA = N,N-dimethylacetoacetamide
NN = 1-nitroso-2-napthol
Bis = bismuthiol
DDPA = dodecylphosphonic acid
CDTA = (1,2-cyclohexylenedinitrilo)tetraacetic acid
DTPA = diethylenetriamine pentaacetic acid
HEDP = hydroxyethylidene diphosphonic acid
NTMP = nitrilo-tris(methylenephosphonic acid)

It can be seen that DDPA was the most effective corrosion inhibitor of those tested although several others were effective at minimizing the SiN removal as well as cobalt loss. The presence of corrosion inhibitors assisted with the lowering of Co loss while maintaining cleaning ability.

EXAMPLE 3

Removal compositions comprising at least one fluoride-containing compound, at least one organic solvent, at least one corrosion inhibitor, and at least one silicon-containing compound, were prepared and the etch rates of TiON (at 20 min) and SiN (at 30 min) were determined as well as the loss of cobalt (at 5 min) from a cobalt coupon. The experiments were all performed at 40° C. The results are provided in Table 3 below.

TABLE 3

Formulations GG-II

| Form. | | DDPA/ wt % | TMAS/ wt % | TiON ER/Å min$^{-1}$ | Co loss/Å min$^{-1}$ | SiN ER/Å min$^{-1}$ |
|---|---|---|---|---|---|---|
| GG | 99.59 wt % formulation A for a total solution weight of 100.000 wt % | 0.05 | 0.36 | <0.5 | 55.6 | 0.8 |
| HH | 99.39 wt % formulation A for a total solution weight of 100.000 wt % | 0.25 | 0.36 | <0.5 | 35.7 | 1.4 |
| II | 99.03 wt % formulation A for a total solution weight of 100.000 wt % | 0.25 | 0.72 | 0.5 | | <0.5 |

It can be seen that TMAS helped protect SiN, similar to that seen when a dielectric passivating agent is present.

EXAMPLE 4

Removal compositions comprising at least one fluoride-containing compound, at least one organic solvent, at least one dielectric passivating agent, and at least one corrosion inhibitor, were prepared and the etch rates of TiON (at 20 min) and SiN (at 60 min) were determined as well as the loss of cobalt (at 5 min) from a cobalt coupon. The experiments were all performed at 40° C. The results are provided in Table 4 below.

TABLE 4

Formulations JJ-AB

| Form. | | boric acid/ wt % | DDPA/ wt % | TiON ER/Å min$^{-1}$ | Co loss/Å min$^{-1}$ | SiN ER/Å min$^{-1}$ |
|---|---|---|---|---|---|---|
| JJ | 99.9 wt % formulation A for a total solution weight of 100.000 wt % | 0.05 | 0.05 | 2.0 | 28.6 | 3.6 |
| KK | 99.25 wt % formulation A for a total solution weight of 100.000 wt % | 0.05 | 0.25 | 1.1 | 15.1 | 3.6 |
| LL | 99.85 wt % formulation A for a total solution weight of 100.000 wt % | 0.10 | 0.05 | 0.9 | 28.0 | 2.5 |
| MM | 99.65 wt % formulation A for a total solution weight of 100.000 wt % | 0.10 | 0.25 | 0.7 | 10.3 | 2.5 |

TABLE 4-continued

Formulations JJ-AB

| Form. | boric acid/ wt % | DDPA/ wt % | TiON ER/Å min$^{-1}$ | Co loss/Å min$^{-1}$ | SiN ER/Å min$^{-1}$ |
|---|---|---|---|---|---|
| NN | 99.85 wt % formulation A for a total solution weight of 100.000 wt % | 0.15 | | <0.5 | 159.5 | 1.4 |
| OO | 99.8 wt % formulation A for a total solution weight of 100.000 wt % | 0.15 | 0.05 | 0.6 | 38.0 | 1.8 |
| PP | 99.6 wt % formulation A for a total solution weight of 100.000 wt % | 0.15 | 0.25 | 0.5 | 16.8 | 1.8 |
| QQ | 99.75 wt % formulation A for a total solution weight of 100.000 wt % | 0.20 | 0.05 | <0.5 | 31.6 | 1.1 |
| RR | 99.55 wt % formulation A for a total solution weight of 100.000 wt % | 0.20 | 0.25 | <0.5 | 11.5 | 1.3 |
| SS | 99.75 wt % formulation A for a total solution weight of 100.000 wt % | 0.25 | | <0.5 | 101.5 | 0.9 |
| TT | 99.7 wt % formulation A for a total solution weight of 100.000 wt % | 0.25 | 0.05 | <0.5 | 17.1 | <0.5 |
| UU | 99.5 wt % formulation A for a total solution weight of 100.000 wt % | 0.25 | 0.25 | <0.5 | 12.4 | <0.5 |
| VV | 99.65 wt % formulation A for a total solution weight of 100.000 wt % | 0.30 | 0.05 | <0.5 | 14.5 | 0.8 |
| WW | 99.6 wt % formulation A for a total solution weight of 100.000 wt % | 0.35 | 0.05 | <0.5 | 28.2 | <0.5 |
| XX | 99.55 wt % formulation A for a total solution weight of 100.000 wt % | 0.40 | 0.05 | <0.5 | 14.3 | <0.5 |
| YY | 99.5 wt % formulation A for a total solution weight of 100.000 wt % | 0.45 | 0.05 | <0.5 | 20.1 | <0.5 |
| ZZ | 99.45 wt % formulation A for a total solution weight of 100.000 wt % | 0.50 | 0.05 | <0.5 | 8.0 | <0.5 |
| AB | 99.4 wt % formulation A for a total solution weight of 100.000 wt % | 0.55 | 0.05 | <0.5 | 12.5 | <0.5 |

It can be seen that the presence of the dielectric passivating agent (i.e., boric acid) had the largest impact on minimizing cobalt loss and the silicon nitride etch rate.

EXAMPLE 5

Removal compositions comprising at least one fluoride-containing compound, propylene glycol (PG), and at least one dielectric passivating agent and/or at least one corrosion inhibitor and/or at least one silicon-containing compound, were prepared and the etch rates of TiON (at 20 min) and SiN (at 30 min) were determined as well as the loss of cobalt (at 5 min) from a cobalt coupon. The experiments were all performed at 40° C. The results are provided in Table 5 below.

TABLE 5

Formulations AC-AI

| Form. | HF (48%)/ wt % | PG/ wt % | boric acid/ wt % | TMAS/ wt % | DDPA/ wt % | TiON ER/Å min$^{-1}$ | Co loss/Å min$^{-1}$ | SiN ER/Å min$^{-1}$ |
|---|---|---|---|---|---|---|---|---|
| AC | 0.750 | 99.25 | | | | 0.8 | 107.6 | 2.9 |
| AD | 0.750 | 98.95 | 0.25 | | 0.05 | <0.5 | 25.9 | <0.5 |
| AE | 0.750 | 98.75 | 0.25 | | 0.25 | <0.5 | 12.5 | <0.5 |
| AF | 0.750 | 99.00 | 0.2 | | 0.05 | <0.5 | 36.2 | 1.0 |
| AG | 0.750 | 98.80 | 0.2 | | 0.25 | <0.5 | 51.8 | 1.2 |
| AH | 0.750 | 99.59 | | 0.36 | 0.05 | <0.5 | 53.7 | 0.9 |
| AI | 0.750 | 99.39 | | 0.36 | 0.25 | <0.5 | 33.6 | 0.9 |

Of note, formulation AE was compatible with Co and SiN at 45° C. without sacrificing cleaning efficacy.

EXAMPLE 6

Removal compositions comprising 0.25 wt % ammonium bifluoride, 29.25 wt % n-butanol, ethylene glycol (EG), at least one dielectric passivating agent and/or at least one corrosion inhibitor, were prepared and the etch rates of TiON (at 20 min) and SiN (at 60 min) were determined as well as the loss of cobalt (at 5 min) from a cobalt coupon. The experiments were all performed at 35° C. The results are provided in Table 6 below.

TABLE 6

Formulations AJ-AL

| Form. | EG/ wt % | boric acid/ wt % | Tween 80/ wt % | DDPA/ wt % | TiON ER/Å $min^{-1}$ | Co loss/Å $min^{-1}$ | SiN ER/Å $min^{-1}$ |
|---|---|---|---|---|---|---|---|
| AJ | 70.330 | 0.17 | | | <0.5 | 47.4 | 0.6 |
| AK | 70.250 | 0.25 | | | <0.5 | 31.3 | <0.5 |
| AL | 70.219 | 0.25 | 0.030 | 0.001 | <0.5 | 29.6 | <0.5 |

It can be seen that boric acid improved SiN compatibility and the DDPA/Tween 80 combination helped decrease initial Co loss.

EXAMPLE 7

Removal compositions comprising at least one fluoride-containing compound, 29.250 n-butanol, and at least one additional organic solvent, were prepared and the etch rates of TiON (at 20 min) and SiN (at 60 min) were determined as well as the loss of cobalt (at 5 min) from a cobalt coupon. The experiments were all performed at 35° C. The results are provided in Table 7 below.

TABLE 7

Formulations AN-AS

| Form. | Additional organic solvent/wt % | Fluoride-containing compound/wt % | TiON ER/ Å $min^{-1}$ | Co loss/ Å $min^{-1}$ | SiN ER/ Å $min^{-1}$ |
|---|---|---|---|---|---|
| AN | 70.000 wt % EG | 0.750 wt % fluoroboric acid (48%) | <0.5 | 133.0 | <0.5 |
| AO | 70.000 wt % EG | 0.250 wt % fluoroboric acid (48%) | <0.5 | 111.5 | <0.5 |
| AP | 68.950 wt % 1,4-butanediol | 1.800 wt % TMAF (20%) | <0.5 | 66.1 | 4.1 |
| AQ | 67.150 wt % 1,4-butanediol | 3.600 wt % TMAF (20%) | <0.5 | 38.1 | 0.6 |
| AR | 67.150 wt % EG | 3.600 wt % TMAF (20%) | <0.5 | 12.6 | <0.5 |
| AS | 63.550 wt % EG | 7.200 wt % TMAF (20%) | <0.5 | 20.0 | <0.5 |

It can be seen that initial Co loss decreases with increasing amounts of TMAF and decreases even further with EG as the additional organic solvent. The SiN etch rate decreased significantly with etchant replacement.

Accordingly, while the invention has been described herein in reference to specific aspects, features and illustrative embodiments of the invention, it will be appreciated that the utility of the invention is not thus limited, but rather extends to and encompasses numerous other aspects, features, and embodiments. Accordingly, the claims hereafter set forth are intended to be correspondingly broadly construed, as including all such aspects, features and embodiments, within their spirit and scope.

What is claimed is:

1. A liquid removal composition, comprising about 0.01 to about 25wt % of at least one fluoride-containing compound, about 0.01 wt % to about 99.9 wt % of at least one organic solvent, about 0.01 wt % to about 10 wt % water, about 0.01 wt % to about 20 wt % of at least one corrosion inhibitor, and about 0.01 wt % to about 2 wt % of at least one of a dielectric passivating agent and/or a silicon-containing compound, the dielectric passivating agent comprising a species selected from the group consisting of boric acid, ammonium biborate, ammonium pentaborate, sodium tetraborate, ammonium biborate, 3-hydroxy-2-naphthoic acid, iminodiacetic acid, and combinations thereof, wherein the composition is free of oxidizing agents and wherein said liquid removal composition is useful for removing anti-reflective coating (ARC) materials and/or post-etch residue from a microelectronic device having such materials and/or residue thereon.

2. The liquid removal composition of claim 1, wherein the corrosion inhibitor comprises a species selected from the group consisting of benzotriazole (BTA), 1,2,4-triazole (TAZ), 5-aminotetrazole (ATA), 1-hydroxybenzotriazole, 5-amino-1,3,4-thiadiazol-2-thiol, 3-amino-1H-1,2,4 triazole, 3,5-diamino-1,2,4-triazole, tolyltriazole, 5-phenyl-benzotriazole, 5-nitro-benzotriazole, 3-amino-5-mercapto-1,2,4-triazole, 1-amino-1,2,4-triazole, 2-(5-amino-pentyl)-benzotriazole, 1-amino-1,2,3-triazole, 1-amino-5-methyl-1,2,3-triazole, 3-mercapto-1,2,4-triazole, 3-isopropyl-1,2,4-triazole, 5-phenylthiolbenzotriazole,halo-benzotriazoles (halo=F, Cl, Br or I), naphthotriazole, 1H-tetrazole-5-acetic acid, 2-mercaptobenzothiazole (2-MBT), 1-phenyl-2-tetrazoline-5-thione, 2-mercaptobenzimidazole (MBI), 4-methyl-2-phenylimidazole, 2-mercaptothiazoline, 2,4-diamino-6-methyl-1,3,5-triazine, thiazole, imidazole, benzimidazole, triazine,methyltetrazole, Bismuthiol I, 1,3-dimethyl-2-imidazolidinone, 1,5-pentamethylenetetrazole, 1-phenyl-5-mercaptotetrazole, diaminomethyltriazine, imidazoline thione, 4-methyl-4H-1,2,4-triazole-3-thiol, 5-amino-1,3,4-thiadiazole-2-thiol, benzothiazole, tritolyl phosphate, indazole, DNA bases, pyrazoles, propanethiol, ascorbic acid, thiourea, 1,1,3,3-tetramethylurea, urea, urea derivatives, uric acid, potassium ethylxanthate, glycine, dodecylbenzenesulfonic acid (DDBSA), tartaric acid, N,N-dimethylacetoacetamide, 1-nitroso-2-napthol, polysorbate 80, dodecylphosphonic acid (DDPA), ethylenediaminetetraacetic acid (EDTA), (1,2-cyclohexylenedinitrilo)tetraacetic acid (CDTA), diethylenetriamine pentaacetic acid (DTPA), 2-phosphonobutane-1,2,4-tricarboxylic acid (PBTCA), ethylendiamine disuccinic acid, propylenediamine tetraacetic acid; phosphonic acid; hydroxyethylidene diphosphonic acid (HEDP), 1-hydroxyethane-1,1-diphosphonic acid, nitrilo-tris(methylenephosphonic acid) (NTMP), amino tri (methylene phosphonic acid), diethylenetriamine penta(methylenephosphonic acid), ethylenediamine tetra(methylene phosphonic acid) (EDTMPA), and combinations thereof.

3. The liquid removal composition of claim 1, comprising about 0.01wt % to about 2 wt % of at least one silicon-containing compound, wherein the silicon-containing compound comprises a species selected from the group consisting of methyltrimethoxysilane, dimethyldimethoxysilane, phenyltrimethoxysilane, tetraethoxysilane (TEOS), N-propyltrimethoxysilane, N-propyltriethoxysilane, hexyltrimethoxysilane, hexyltriethoxysilane, ammonium hexafluorosilicate, sodium silicate, potassium silicate, tetramethyl ammonium silicate (TMAS), tetraacetoxysilane, di-t-butoxydiacetoxysilane, acetoxymethyltriethoxysilane, and combinations thereof.

4. The liquid removal composition of claim 1, wherein the at least one organic solvent comprises a compound selected from the group consisting of tetramethylene sulfone, methanol, ethanol, 1-propanol, 2-propanol, 1-butanol, 2-butanol, t-butanol, 1-pentanol, hexanol, cyclohexanol, 2-ethyl-1-hexanol, benzyl alcohol, furfuryl alcohol, ethylene glycol, diethylene glycol, propylene glycol (1,2-propanediol), tetramethylene glycol (1,4-butanediol), 2,3-butanediol, 1,3-butanediol, neopentyl glycol, diethylene glycol monomethyl ether, triethylene glycol monomethyl ether, diethylene glycol monoethyl ether, triethylene glycol monoethyl ether, ethylene glycol monopropyl ether, ethylene glycol monobutyl ether, diethylene glycol monobutyl ether, triethylene glycol monobutyl ether, propylene glycol methyl ether, dipropylene glycol methyl ether, tripropylene glycol methyl ether, propylene glycol n-propyl ether, dipropylene glycol n-propyl ether, tripropylene glycol n-propyl ether, propylene glycol n-butyl ether, dipropylene glycol n-butyl ether, and tripropylene glycol n-butyl ether, dimethylacetamide, formamide, dimethylformamide, 1-methyl-2- pyrrolidinone, dimethyl sulfoxide, tetrahydrofurfuryl alcohol (THFA), and combinations thereof.

5. The liquid removal composition of claim 1, wherein at least one organic solvent comprises a compound selected from the group consisting of ethylene glycol, propylene glycol, 2-propanol, 1-propanol, 1-butanol, 1,4-butanediol, 1-pentanol, and combinations thereof.

6. The liquid removal composition of claim 1, wherein the at least one organic solvent comprises a compound selected from the group consisting of 1-butanol, 1,4-butanediol, and combinations thereof.

7. The liquid removal composition of claim 1, comprising about 0.01wt % to about 2 wt % of at least one dielectric passivating agent and about 0.01 wt % to about 2wt % of at least one silicon-containing compound.

8. The liquid removal composition of claim 1, wherein the composition comprises water and wherein water is present in an amount from about 0.01 wt % to about 1wt %, based on the total weight of the composition.

9. The liquid removal composition of claim 1, wherein the at least one fluoride-containing compound comprises a species selected from the group consisting of hydrogen fluoride, ammonium fluoride, fluoroboric acid, tetramethylammonium fluoride (TMAF), triethanolamine hydrofluoric acid salt, ammonium bifluoride ((NH4)HF2), tetraalkylammonium bifluorides ((R)4NHF2), and combinations thereof.

10. The liquid removal composition of claim 1, wherein the pH of the composition in a range from about 1 to about 5.

11. The liquid removal composition of claim 1, wherein the composition removes greater than 95% of the ARC material and/or post-etch residue and has a cobalt etch rate less than about 5 Å min-1 at 40° C.

12. The liquid removal composition of claim 1, further comprising residue material selected from the group consisting of ARC residue, post-etch residue, and combinations thereof.

13. A method of removing ARC material and/or post-etch residue from a microelectronic device having said material and residue thereon, said method comprising contacting the microelectronic device with a liquid removal composition for sufficient time to at least partially remove said material and residue from the microelectronic device, wherein the liquid removal composition comprises about 0.01 wt % to about 25 wt % of at least one fluoride-containing compound, about 0.01 wt % to about 99.9 wt % of at least one organic solvent, about 0.01 wt % to about 10 wt % water, about 0.01 wt % to about 20 wt % of at least one corrosion inhibitor, and about 0.01 wt % to about 2 wt % of at least one of a dielectric passivating agent and/or a one silicon-containing compound, wherein the dielectric passivating agent comprises a species selected from the group consisting of boric acid, ammonium biborate, ammonium pentaborate, sodium tetraborate, ammonium biborate, 3-hydroxy-2-naphthoic acid, iminodiacetic acid, and combinations thereof and wherein the composition is free of oxidizing agents.

14. The method of claim 13, wherein the microelectronic device is of an article selected from the group consisting of semiconductor substrates, flat panel displays, and microelectromechanical systems (MEMS).

15. The method of claim 13, wherein said contacting is carried out for a time of from about 1 minute to about 60 minutes.

16. The method of claim 13, wherein said contacting is carried out at temperature in a range of from about 20° C. to about 80° C.

17. The method of claim 13, wherein the corrosion inhibitor comprises a species selected from the group consisting of benzotriazole (BTA), 1,2,4-triazole (TAZ), 5-aminotetrazole (ATA), 1-hydroxybenzotriazole, 5-amino-1,3,4-thiadiazol-2-thiol, 3-amino-1H-1,2,4 triazole, 3,5-diamino-1,2,4-triazole, tolyltriazole, 5-phenyl-benzotriazole, 5-nitrobenzotriazole, 3-amino-5-mercapto-1,2,4-triazole, 1-amino-1,2,4-triazole, 2-(5-amino-pentyl) -benzotriazole, 1-amino-1,2,3-triazole, 1-amino-5-methyl-1,2,3-triazole, 3-mercapto-1,2,4-triazole, 3-isopropyl-1,2,4-triazole, 5-phenylthiolbenzotriazole,halo-benzotriazoles (halo=F, Cl, Br or I), naphthotriazole, 1H-tetrazole-5-acetic acid, 2-mercaptobenzothiazole (2-MBT), 1-phenyl-2-tetrazoline-5-thione, 2-mercaptobenzimidazole (MBI), 4-methyl-2-phenylimidazole, 2-mercaptothiazoline, 2,4-diamino-6-methyl-1,3,5-triazine, thiazole, imidazole, benzimidazole, triazine,methyltetrazole, Bismuthiol I, 1,3-dimethyl-2-imidazolidinone, 1,5-pentamethylenetetrazole, 1-phenyl-5-mercaptotetrazole, diaminomethyltriazine, imidazoline thione, 4-methyl-4H-1, 2,4-triazole-3-thiol, 5-amino-1,3,4-thiadiazole-2-thiol, benzothiazole, tritolyl phosphate, indazole, DNA bases, pyrazoles, propanethiol, ascorbic acid, thiourea, 1,1,3,3-tetramethylurea, urea, urea derivatives, uric acid, potassium ethylxanthate, glycine, dodecylbenzenesulfonic acid (DDBSA), tartaric acid, N,N-dimethylacetoacetamide, 1-nitroso-2-napthol, polysorbate 80, dodecylphosphonic acid (DDPA), ethylenediaminetetraacetic acid (EDTA), (1,2-cyclohexylenedinitrilo)tetraacetic acid (CDTA), diethylenetriamine pentaacetic acid (DTPA), 2-phosphonobutane-1,2,4-tricarboxylic acid (PBTCA), ethylendiamine disuccinic acid, propylenediamine tetraacetic acid; phosphonic acid; hydroxyethylidene diphosphonic acid (HEDP), 1-hydroxyethane-1, 1-diphosphonic acid, nitrilo-tris(methylenephosphonic acid) (NTMP), amino tri (methylene phosphonic acid), diethylenetriamine penta(methylenephosphonic acid), ethylenediamine tetra(methylene phosphonic acid) (EDTMPA), and combinations thereof.

18. The method of claim 13, wherein the liquid removal composition comprises about 0.01 wt % to about 2 wt % of at least one silicon-containing compound, wherein the silicon-containing compound comprises a species selected from the group consisting of methyltrimethoxysilane, dimethyldimethoxysilane, phenyltrimethoxysilane, tetraethoxysilane (TEOS), N-propyltrimethoxysilane, Npropyltriethoxysilane, hexyltrimethoxysilane, hexyltriethoxysilane, ammonium hexaflurorosilicate, sodium silicate, potassium silicate, tetramethyl ammonium silicate (TMAS), tetraacetoxysilane, di-tbutoxydiacetoxysilane, acetoxymethyltriethoxysilane, and combinations thereof.

* * * * *